(12) United States Patent
Dartois

(10) Patent No.: US 6,885,709 B1
(45) Date of Patent: Apr. 26, 2005

(54) METHOD FOR LINEARISING A POWER AMPLIFIER OVER A WIDE FREQUENCY BAND

(75) Inventor: Luc Dartois, Carrieres sous Poissy (FR)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/429,026

(22) Filed: Oct. 29, 1999

(30) Foreign Application Priority Data

Jun. 30, 1999 (EP) .............................. 99401627

(51) Int. Cl.[7] .......................... H04L 25/03; H04L 25/49
(52) U.S. Cl. ...................... 375/297; 375/285; 330/149; 330/136
(58) Field of Search ................................ 375/260, 285, 375/296, 297, 245, 232; 330/129, 136, 149; 455/126

(56) References Cited

U.S. PATENT DOCUMENTS

| | | | |
|---|---|---|---|
| 4,604,589 A | | 8/1986 | McGann |
| 4,890,300 A | * | 12/1989 | Andrews .................... 375/297 |
| 5,252,930 A | * | 10/1993 | Blauvelt ..................... 330/149 |
| 5,262,734 A | * | 11/1993 | Dent et al. .................... 330/52 |
| 5,334,946 A | * | 8/1994 | Kenington et al. ......... 330/144 |
| 5,424,680 A | | 6/1995 | Nazarathy et al. |
| 5,455,538 A | | 10/1995 | Kobayashi et al. |
| 5,489,879 A | * | 2/1996 | English ....................... 332/103 |
| 5,524,286 A | * | 6/1996 | Chiesa et al. ............... 455/126 |
| 5,535,246 A | | 7/1996 | Beech |
| 5,900,778 A | * | 5/1999 | Stonick et al. .............. 330/149 |
| 5,991,308 A | * | 11/1999 | Fuhrmann et al. ...... 370/395.53 |
| 6,075,411 A | * | 6/2000 | Briffa et al. ................. 330/149 |
| 6,147,553 A | * | 11/2000 | Kolanek ....................... 330/10 |
| 6,157,811 A | * | 12/2000 | Dent .......................... 455/12.1 |
| 6,240,278 B1 | * | 5/2001 | Midya et al. ................ 455/126 |
| 6,493,543 B1 | * | 12/2002 | Shin et al. ................... 455/126 |
| 6,542,562 B1 | * | 4/2003 | Ostberg et al. ............. 375/350 |
| 6,590,940 B1 | * | 7/2003 | Camp et al. ................. 375/297 |
| 6,600,792 B2 | * | 7/2003 | Antonio et al. ............. 375/297 |
| 6,609,008 B1 | * | 8/2003 | Whang et al. .............. 455/522 |

FOREIGN PATENT DOCUMENTS

| | | |
|---|---|---|
| EP | 0 580 125 A1 | 1/1994 |
| EP | 0 774 833 A1 | 5/1997 |
| GB | 2 245 115 A | 12/1991 |

\* cited by examiner

Primary Examiner—Jay Patel
Assistant Examiner—Qutub Ghulamali
(74) Attorney, Agent, or Firm—Sughrue Mion, PLLC

(57) ABSTRACT

A method for the linearization of a wide frequency band power amplifier. The frequency band of operation of the amplifier is divided into at least two groups or subbands. The instantaneous frequency of each sampled input signal is measured in order to determine the group or subband to which it belongs, and predistortions are applied to the input signal, these predistortions depending on the frequency group. The method is particularly useful for the linearization of a power amplifier of a transmitter.

14 Claims, 1 Drawing Sheet

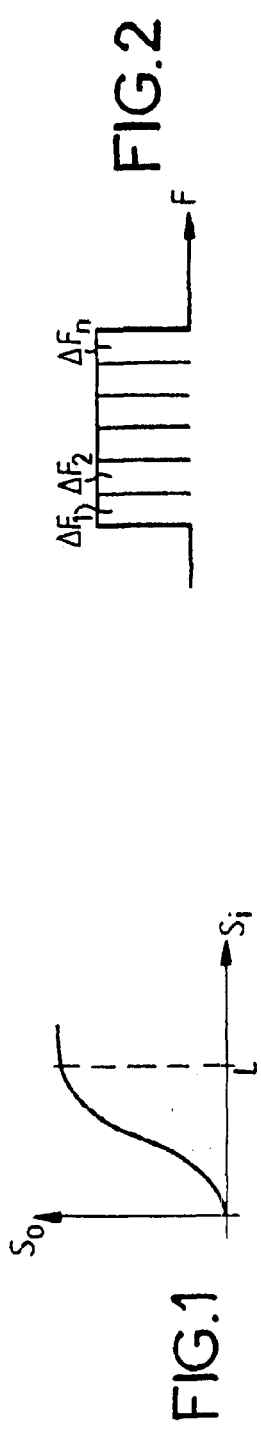
FIG.1
FIG.2
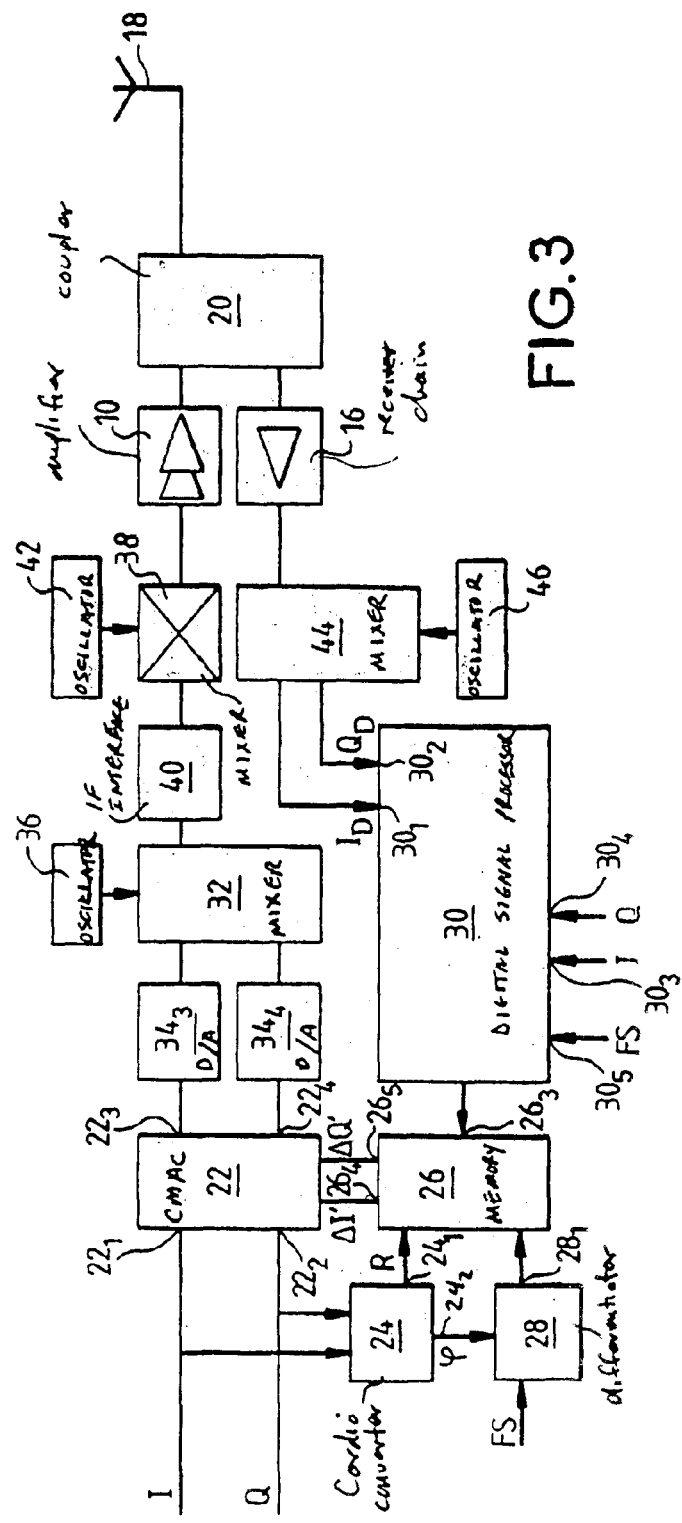
FIG.3

METHOD FOR LINEARISING A POWER AMPLIFIER OVER A WIDE FREQUENCY BAND

BACKGROUND OF THE INVENTION

The invention relates to a method for linearising a power amplifier and to an amplifier using such method. It relates also to a transmitter comprising a power amplifier of this kind.

Generally, power amplifiers are used near saturation in order to obtain the most efficient use of such amplifiers. However, near saturation, the amplifier has a non linear behavior, i.e. the gain decreases sharply for high input signals compared to smaller input signals; moreover the output signal is phase distorted due to the well known AM/PM conversion, i.e. due to the conversion of amplitude modulation into phase modulation.

The distortion of the output signal with respect to the input signal is generally not admissible as far as non constant envelope signals are used. This is more particularly true in the field of telecommunications which necessitates both power efficiency and good qualities of signals.

In order to linearise amplifiers, several solutions are known. However, it has been observed that none of the conventional solutions can provide power efficiency over a wide frequency band as it is often requested more particularly in the above mentioned field of telecommunications. For instance, in future radio telephone systems, use will be made of CDMA (Code Division Multiple Access) where the modulation is spread over a frequency band of several megahertz. In fact, in CDMA, to each symbol, such as a bit, is superposed a code which is a sequence at a higher frequency.

The only solution which is known, up to now, for the linearisation over a wide frequency band of a non constant envelope signal is the analog feed forward technology wherein no feed back loop is provided. It corrects in real time, the non-linearities, even if they are frequency dependent. In the analog feed forward technology, the non linearities are substracted from the input signal to amplify.

However, this solution has a very low power efficiency. According to the present state of the art the total power efficiency of an RF amplifier with analog feed forward linearisation is about 6% and a power amplifier has an efficiency of about 30% or more when it is not provided with this linearisation. Moreover, analog feed-forward is expensive and increases significantly the size of the device. The high cost comes from the fact that the corresponding circuits need calibration and tuning.

It is also known to use digital predistortion which has the advantage of a good efficiency. However, it has been observed that digital predistortions of amplifiers work correctly only on narrow and medium frequency bands.

SUMMARY OF THE INVENTION

In order to provide a power efficient and wide band linearisation of power amplifiers, the method according to the invention is characterized in that the instantaneous frequency of each sampled input signal is measured and in that, to each real time sample, is applied a digital predistortion which depends on the measured instantaneous frequency.

In one embodiment, the digital predistortion is performed with a set of look-up tables, each look-up table corresponding to a given frequency or to a given frequency domain or subband.

For each real time sample, the look-up table corresponding to the measured frequency applies to the input signal a predistortion which compensates, at the output of the amplifier, the distortions which would appear without the predistortions.

In an other embodiment, the predistortion is, for each frequency, represented by a set of coefficients which are coefficients of a polynom for which the variable is the amplitude of the input signal and which provide the necessary predistortion for the input signal.

With this last embodiment, it is possible to use less memory capacity than with a look-up table. In fact, in this latter case, it is necessary to keep in memory for each frequency or frequency domain, the predistortion values for all possible values of the amplitude of the input signal; on the contrary with polynom coefficients, it is only necessary to keep in memory a set of coefficients for each frequency or frequency domain. However, with this embodiment, it is necessary to use more calculation in order to derive (calculate the polynoms) the predistortion from the input amplitude value and the coefficients.

According to a preferred embodiment, in order to limit the capacity of the memory for storing tables or coefficients, the accuracy of the signal representing the frequency is lower than the accuracy of the amplitude of the input signal. Therefore, it is possible to limit the number of look-up tables or the number of sets of coefficients. For instance, if the amplitude of the input signal is represented by a sixteen bit number, the frequency may be represented by a four bit number. In fact, it has been observed that, although non linearities are frequency dependent, on narrow or medium bands, they are relatively frequency insensitive inside a narrow or medium band. In other words, the wide frequency band to be amplified may be divided into a limited number of domains inside which the same look-up table or the same coefficients may be used.

In order to measure or estimate the instantaneous frequency of each input sample, in an embodiment, the phase between two successive samples is measured, for instance the difference between the phase of the present sample and the phase of the previous sample, or the difference between the phase of the present sample and the phase of the next sample. It is also possible to estimate the instantaneous frequency through an interpolation of the measurement of the phase differences of several successive samples.

As generally the samples are represented in rectangular coordinates by an in phase abscissa I and a quadrature ordinate Q, in order to derive the amplitude and phase, it is necessary to use a rectangular to polar coordinate conversion, for instance, a Cordic conversion. This last conversion method is well known; as it is based on successive additions and subtractions it may be easily realized into an integrated circuit.

The method and the amplifier according to the invention may be used either in base band or in intermediate frequency (IF) band according to the availability and performances of D/A converters.

Due to aging, drifts, variations of power voltages and other operating parameters, it may be necessary to update periodically, or from time to time, the look-up tables or the polynomial coefficients. These tables or coefficients may be updated through measurements of output signals from the amplifier and conventional algorithms which modify the tables or coefficients in view of the measurements, more particularly in view of the comparison between output and input signals.

The input signals used for the updating method may be specific test signals, or the regular input signals.

The measurement of signals at the output of the amplifier is performed by a receiver. In the case of a telecommunication equipment the power amplifier is used in a transmitter, which is generally associated with a receiver. In that case, the receiver used for the measurement of output signals may be the receiver associated with the transmitter for the duplex transmission/reception. It may also be a specific receiver, such as a coherent receiver (heterodyne or superheterodyne).

The invention relates generally to a method for the linearisation of a wide frequency band power amplifier. According to the invention, the frequency band of operation of the amplifier is divided into at least two groups or subbands, the instantaneous frequency of each sampled input signal is measured in order to determine the group or subband to which it belongs and, predistortions are applied to the input signal, these predistortions depending on the frequency group.

In an embodiment, the frequency dependent predistortions are provided by a set of look-up tables, the number of look-up tables being equal to the number of frequency subbands, a look-up table containing, for each amplitude of the input signal, two correction values representing the amplitude and the phase of a predistortion.

In another embodiment, the predistortion values are calculated by using coefficients of a polynom of which the variable is the amplitude of the input signal.

In a further embodiment, the instantaneous frequency of the sampled input signal is calculated by the derivative of the phase of this input signal.

The instantaneous frequency of the sampled input signal may be calculated by the substraction of the phases of two successive samples.

The input sampled signals are, in an embodiment, represented by their rectangular coordinates in a complex plane and their rectangular coordinates are converted into polar coordinates, the phase being used to determine the frequency group and the amplitude being used to determine the predistortion values in the frequency group.

According to an embodiment, the accuracy of measurement of the instantaneous frequency is lower than the accuracy of the input signal.

The predistortion values or coefficients may be periodically updated by measuring the effect of input test or regular signals on the output signal of the amplifier and by calculating the predistortion values or coefficients based on this measurement.

The invention relates also to an application of the method to the linearisation of the power amplifier of a transmitter.

Such transmitter may transmit CDMA signals.

In an embodiment, the transmitter comprises a coherent receiver which is used for the updating of predistortion values or coefficients.

The invention relates to an application of the method to a station comprising a transmitter with a power amplifier to be linearised and a receiver, wherein the receiver is used for measuring the output of the power amplifier for updating predistortion values or coefficients.

BRIEF DESCRIPTION OF THE DRAWINGS

Other features and advantages of the invention will appear with the description of certain of its embodiments, this description being made in conjunction with the following drawings which represent:

FIG. 1, a diagram showing the variation of the output signal of an amplifier versus its input signal, FIG. 2 is a frequency band diagram showing one aspect of the invention, and FIG. 3 is a schematic representation of one embodiment of the invention.

MORE DETAILED DESCRIPTION OF THE INVENTION

The example which will be now described with reference to the drawings refers to a transmitter/receiver for a cellular telephone base station of the third generation, i.e. of the UMTS (Universal Mobile Telephone System) which is presently under development.

It is recalled here that in a cellular telephone system, each subscriber is connected to a network through a base station which is called a base transceiver station (BTS). This station receives communications from subscribers and transmits them to other subscribers. The capacity of the telecommunications system depends on performances of such base station, and, among others, on the efficiency of its power amplifiers and on RF coupling constraints.

In order to minimize the cost of such station and to comply with the spectral shaping requested by standards, it is necessary that it uses a single amplifier. As this system is using CDMA between subscribers and base stations and as CDMA may be considered as noise having important variations in envelope (due to the stacking of a plurality of users' spreading codes) over a wide band of several megahertz, it is essential for this application to properly linearise the amplifier over a wide band. If the power amplifier was not linearised, it would be necessary either to use large guard bands, i.e. unused spectrum, between adjacent channels in order to avoid interference from one channel to the other due to non linearities, or to overdimension power amplifiers (back off).

FIG. 1 is a diagram of operation of an amplifier 10 (FIG. 3) wherein it appears that, when the input signal $S_i$ becomes greater than a given value L, the output signal $S_o$ remains practically constant. This well known feature of an amplifier is called "saturation".

In order to use at best such amplifier, it is preferable to use it near saturation. However, in this case, the gain (the ratio $S_o/S_i$) becomes non constant in amplitude and phase and this non constant behavior generates in band distortions of the output signal as well as out of band interferences which may be detrimental not only to the transmitted signal, but also to signals which may be transmitted simultaneously, at the same frequency or at different frequencies.

In order to prevent these non linearities, it is known to apply predistortions to the input signal which compensate the distortions which would be, without these predistortions, present in the output signal.

According to the invention, the frequency band $\Delta F$ of the power amplifier is subdivided into domains or subbands $\Delta F_1, \Delta F_2, \ldots \Delta F_n$ (FIG. 2) and the corresponding predistortion is provided for each subband.

FIG. 3 represents a base station comprising the above mentioned power amplifier 10 and also a coherent receiver chain 16. The output of amplifier 10 is connected to a transmitting/receiving antenna 18 through a coupler 20. The coupler is used also to connect the antenna 18 to the input of the receiver chain 16.

The receiver chain is a dedicated chain used for the measurement of output signals of the amplifier in order to update tables or sets of coefficients as will be explained herein below.

The signals to be amplified by power amplifier 10 are samples at a sample frequency of 32,768 megahertz. These samples are, classically, represented by their complex coordinates I and Q. The coordinates I and Q are applied to the respective 20 inputs $22_1$ and $22_2$ of a complex multiplier accumulator (CMAC) 22, the function of which will be described later. These two coordinates I and Q, which represent the real time signal in rectangular coordinates are converted into polar coordinates by a Cordic converter 24. This converter 24 has two outputs $24_1$ and $24_2$. The output $24_1$ provides the amplitude R of the instantaneous input signal and the output $24_2$ provides the phase $\phi$ of the instantaneous input signal.

The R output $24_1$ is connected to the amplitude input of a RAM memory containing look-up tables (LUT) and the output $24_2$ of converter 24 is connected to the input of a differentiator 28 which operates at the sample frequency. The output $28_1$ of this differentiator is connected to a frequency input $26_2$ of the memory 26.

In an embodiment, the differentiator is a substractor which makes the difference between the phase of the present sample and the phase of the previous sample.

The RAM memory 26 has also one input $26_3$ connected to the output of a digital signal processor 30 which provides signals for updating the values in the tables memorized in RAM 26 as explained hereinafter.

The RAM 26 has two outputs $26_4$, $26_5$ which provide signals $\Delta I'$, $\Delta Q'$ applied to corresponding respective inputs of CMAC 22.

These signals $\Delta I'$ and $\Delta Q'$ are predistortions of, respectively, I and Q which are applied to said coordinates in order to compensate for distortions due to non linearities.

The complex multiplier/accumulator 22 has two digital outputs $22_3$ and $22_4$ on which appear the predistorted components $I_1$ and $Q_1$ of the input sampled signal. These digital components are connected to the respective inputs of a quadrature mixer 32 through, respectively, digital to analog (D/A) converters $34_3$ and $34_4$. The role of this mixer 32 is, in connection with an intermediate frequency local oscillator 36, to convert the input signal, which is in base band frequency, into intermediate frequency.

The output of mixer 32 is connected to the input of another mixer 38 through an intermediate frequency (IF) interface 40 including and IF filter having a band pass of at least 3 (for instance) times the useful channel, this band pass being preferably flat. In fact, if the band pass would correspond exactly to the useful channel, it would not be possible to linearize correctly outside of this channel.

The mixer 38 converts, with a second local oscillator 42, the IF into a signal modulated at the transmission frequency. The output of mixer 38 is connected to the input of power amplifier 10.

The output of receiver chain 16 is also connected to the input of a quadrature mixer 44 which, with a local oscillator 46, converts the received signal into analog $I_D$ and $Q_D$ components of the received signal. These components are in the base band frequency. These signals are applied to respective inputs $30_1$, $30_2$ of processor 30 where they are converted into digital format.

In this example, local oscillators 42 and 46 are synchronized.

The operation is as follows:

In memory 26 are stored n tables, one for each frequency subband $\Delta F_1 \ldots \Delta F_n$. The selection of the table is made according to the instantaneous frequency measured by differentiator 28. The memory 26 delivers signals $\Delta I'$ and $\Delta Q'$ which are combined to components I and Q to predistort the signals which will be provided on mixer 32 and, through mixer 38, on the input of power amplifier 10.

In an embodiment, n=16, i.e. the number of bits of $\Delta\phi=\phi(t)-\phi(t-1)$ has an accuracy of four bits, although the components I and Q may be much more accurate, i.e. may have more bits, for instance 16 bits.

In this embodiment, a look-up table is a table of correspondence between the amplitude R of the input signal provided by output $24_1$ of converter 24, and predistortion components $\Delta I'$ and $\Delta Q'$. In other words, for each increment of amplitude R, $\Delta I'$ and $\Delta Q'$ may vary.

In another embodiment, in order to reduce the capacity of memory 26, instead of a table, a precalculated mathematical model of predistortions is established. The simpler model is a polynomial model wherein:

$$\Delta I'=a_1R+a_2R^2+a_3R^3+\ldots$$

and $$\Delta Q'=b_1R+b_2R^2+b_3R^3+\ldots,$$

and the memory 26 contains only the set of coefficients $a_1$, $a_2 \ldots b_1, b_2 \ldots$ for each frequency, and the polynoms, i.e. the values $\Delta I'$ and $\Delta Q'$, are calculated by a processor, for instance installed between memory 26 and CMAC 22.

The role of processor 30 is to apply on input $26_3$ of memory 26 updated values of each item of the tables (or of each coefficient in case of a polynomial model). In fact, it is necessary to update these values and coefficients at least from time to time, because of aging, temperature variations, variations of power voltages, etc.

This updating is performed by a learning algorithm which is implemented in processor 30. Such learning algorithm being conventional, it is not necessary to describe it in details.

In a first embodiment, the operation of the amplifier is stopped periodically, for instance during periods of low traffic, and test signals are injected at the input. These test signals are detected by the receiver chain 16,44 through the coupler 20 which provides on inputs $30_1$ and $30_2$ analog signals which are used to calculate the predistortion values of the tables, or the coefficients of the polynoms.

For instance, the test signal comprises, for each frequency subband $\Delta F_1$, $\Delta F_2$, etc., two isolated frequencies and the extra spectral values which may appear on inputs $30_1$ and $30_2$ are used to calculate the predistortion values or coefficients.

In a second embodiment, the learning or updating algorithm uses the normal signals applied to the amplifier. Therefore, it is not necessary to stop the operation of the base station for updating. Moreover, with such real time algorithm, it is possible to update more frequently the values or coefficients.

In that case, the processor 30 needs inputs $30_3$ and $30_4$ for the I and Q values applied on the inputs of multiplier 22 and also an input $30_5$ for the sample frequency as a reference signal.

It is to be noted that, whatever learning algorithm is used, instead of using a dedicated associated coherent receiver chain 16,44, the usual base station receiver (not shown) may be used in order to check or measure the effect of test signals, or of normal signals, on the output of amplifier for calculating the predistortion values or coefficients, provided that, during this time, the receiver is tuned to the transmission band.

When the base station is provided with two receivers, which are normally used simultaneously (this is generally called uplink diversity), one of these receivers may be used also for the detection of test signals or normal signals and it provides signals at the input $30_1$, $30_2$ of processor 30. This embodiment is particularly useful when the updating is performed during normal operation because, with the use of the second receiver, it is possible to minimize the effect of the updating on normal performances of the amplifier 10.

It is to be noted that the method and the device which have been described may be used for the linearisation of power amplifiers, the digital input signals being either in intermediate frequency or in base band frequency.

What is claimed is:

1. A method for the linearisation of a wide frequency band power amplifier, said method comprising the steps of:
   estimating the instantaneous frequency of each sample of a plurality of samples of an input signal applied to said amplifier,
   applying predistortions to the input signal, said predistortions having values depending, for each sample, on the estimated frequency of the input signal, and
   dividing the wide frequency band into a limited number of frequency subbands, and providing a corresponding predistortion for each subband.

2. A method according to claim 1, wherein the frequency dependent predistortions are provided by a set of look-up tables, the number of look-up tables being equal to the number of frequencies, a look-up table containing, for each amplitude of the input signal, two correction values representing the amplitude and the phase of a predistortion.

3. A method according to claim 1, wherein the predistortion values or coefficients are periodically updated by measuring the effect of input test or regular signals on the output signal of the amplifier and by calculating the predistortion values or coefficients based on this measurement.

4. The method according to claim 3, wherein said method is applied to a station comprising a transmitter with a power amplifier to be linearised and a receiver, wherein the receiver is used for measuring the output of the power amplifier for updating predistortion values or coefficients.

5. The method according to claim 1, wherein said method is used to linearize the power amplifier of a transmitter.

6. A transmitter including a power amplifier linearised by means of the method according to claim 1.

7. The transmitter according to claim 6, wherein said transmitter comprises a coherent receiver which is used for the updating of predistortion values or coefficients.

8. The transmitter according to claim 6, transmitting CDMA signals.

9. A base transceiver station, including the transmitter according to claim 6.

10. A method for the linearisation of a wide frequency band power amplifier, said method comprising the steps of:
    estimating the instantaneous frequency of each sample of a plurality of samples of an input signal applied to said amplifier, and
    applying predistortions to the input signal, said predistortions having values depending, for each sample, on the estimated frequency of the input signal,
    wherein said predistortion values are calculated by using coefficients of a polynom of which the variable is the amplitude of the input signal.

11. A method for the linearisation of a wide frequency band power amplifier, said method comprising the steps of:
    estimating the instantaneous frequency of each sample of a plurality of samples of an input signal applied to said amplifier, and
    applying predistortions to the input signal, said predistortions having values depending, for each sample, on the estimated frequency of the input signal,
    wherein the instantaneous frequency of the sampled input signal is calculated by the derivative of the phase of the sampled input signal.

12. A method according to claim 11, wherein the instantaneous frequency of the sampled input signal is calculated by the subtraction of the phases of two successive samples.

13. A method for the linearisation of a wide frequency band power amplifier, said method comprising the steps of:
    estimating the instantaneous frequency of each sample of a plurality of samples of an input signal applied to said amplifier, and
    applying predistortions to the input signal, said predistortions having values depending, for each sample, on the estimated frequency of the input signal,
    wherein the samples are represented by their rectangular coordinates in a complex plane, and
    wherein the rectangular coordinates are converted into polar coordinates, the phase of a sample being used to estimate the instantaneous frequency, and the amplitude of the sample being used to determine the predistortion values for said frequency.

14. A method for the linearisation of a wide frequency band power amplifier, said method comprising the steps of:
    estimating the instantaneous frequency of each sample of a plurality of samples of an input signal applied to said amplifier, and
    applying predistortions to the input signal, said predistortions having values depending, for each sample, on the estimated frequency of the input signal,
    wherein the accuracy of estimation of the instantaneous frequency is lower than the accuracy of the amplitude of the input signal.

* * * * *